(12) United States Patent
Sunohara (10) Patent No.: US 7,851,359 B2
(45) Date of Patent: Dec. 14, 2010

(54) SILICON INTERPOSER PRODUCING METHOD, SILICON INTERPOSER AND SEMICONDUCTOR DEVICE PACKAGE AND SEMICONDUCTOR DEVICE INCORPORATING SILICON INTERPOSER

(75) Inventor: Masahiro Sunohara, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 18 days.

(21) Appl. No.: 12/259,564

(22) Filed: Oct. 28, 2008

(65) Prior Publication Data

US 2009/0121345 A1 May 14, 2009

(30) Foreign Application Priority Data

Oct. 30, 2007 (JP) .............................. 2007-281345

(51) Int. Cl.
*H01L 21/20* (2006.01)
(52) U.S. Cl. ................................ 438/667; 257/E21.122
(58) Field of Classification Search ................. 438/667; 257/621, E23.011, E23.036
See application file for complete search history.

(56) References Cited

U.S. PATENT DOCUMENTS

| 5,266,181 | A | * | 11/1993 | Matsumura et al. | .......... | 205/109 |
| 6,193,910 | B1 | * | 2/2001 | Ikai et al. | .................... | 252/512 |
| 2006/0286789 | A1 | * | 12/2006 | Sunohara et al. | ............ | 438/598 |

FOREIGN PATENT DOCUMENTS

JP 2006-351968 12/2006

* cited by examiner

*Primary Examiner*—W. David Coleman
*Assistant Examiner*—Daniel Shook
(74) *Attorney, Agent, or Firm*—Drinker Biddle & Reath LLP (57) ABSTRACT

A silicon interposer producing method comprising the steps of forming through holes 12 in a silicon wafer 11, forming an oxide coating 13 on the silicon wafer 11, providing a power feeding layer 14 for plating on one of the surfaces of the through holes 12, supplying a low thermal expansion filler 15 having a thermal expansion coefficient lower than the thermal expansion coefficient of the conductive material 16 of through-hole electrodes 17 to the through holes 12, filling the conductive material 16 into the through holes 12 by plating to form the through-hole electrodes 17, and removing the power feeding layer 14 for plating.

7 Claims, 9 Drawing Sheets

SILICON INTERPOSER PRODUCING METHOD, SILICON INTERPOSER AND SEMICONDUCTOR DEVICE PACKAGE AND SEMICONDUCTOR DEVICE INCORPORATING SILICON INTERPOSER

BACKGROUND OF THE INVENTION

The present invention relates to a silicon interposer producing method, a silicon interposer and a semiconductor device package and a semiconductor device incorporating the silicon interposer.

In the case that a semiconductor device is produced, for example, by mounting semiconductor elements on a wiring board which is made of a glass epoxy material and on which a wiring pattern is formed, by carrying out soldering or the like, it is necessary to heat the wiring board and the semiconductor elements up to the solder melting temperature. At this time, since the thermal expansion coefficient of the wiring board made of a glass epoxy material is different from that of the semiconductor elements made of silicon, cracks may occur at the connection sections between the wiring board and the semiconductor elements and the semiconductor elements may be damaged when the wiring board and the semiconductor elements become cool after the completion of the soldering processing.

For the purpose of solving the above-mentioned problem due to the difference in thermal expansion coefficient between the wiring board and the semiconductor elements, the so-called silicon interposer is known in which a silicon board made of the same material as that of the semiconductor elements is held between the wiring board and the semiconductor elements to make electrical connections between the wiring board and the semiconductor elements while relieving the stress generated owing to the difference in thermal expansion coefficient therebetween.

The semiconductor device disclosed in Patent document 1 is taken as an example of a semiconductor device incorporating such a silicon interposer. Patent document 1 describes a method for forming through-hole electrodes in a silicon board (silicon interposer). More specifically, after through-hole electrodes are formed in a silicon board, a first metal layer is formed on one face side of the silicon board and a protective tape is attached, and the first metal layer is filled into the through-hole electrodes from the other face side of the silicon board by carrying out electrolytic plating while the first metal layer is used as a power feeding layer, and then the first metal layer other than that at the periphery of the through-hole electrodes is removed.

[Patent document 1] JP-A-2006-351968

However, even in a semiconductor device incorporating a silicon interposer, at portions where the copper filled in a through-hole electrode makes direct contact with silicon oxide serving as an insulating film for protecting the wiring layer, the thermal expansion coefficient (18.3 ppm/deg C) of the copper is significantly different from the thermal expansion coefficient (0.4 ppm/deg C) of the silicon oxide, whereby there arises a problem in which cracks occur at these connection sections.

SUMMARY OF THE INVENTION

To solve the problems, by making the thermal expansion coefficient of through-hole electrodes close to the thermal expansion coefficient of an insulating film connected to the through-hole electrodes, the present invention is intended to provide a silicon interposer producing method and a silicon interposer not causing cracks between the through-hole electrodes and the insulating film making contact with the through-hole electrodes even if a thermal load is repeatedly applied, and the present invention is also intended to provide a semiconductor device package and a semiconductor device incorporating the silicon interposer.

According to a first aspect of the invention, there is provided a method for producing a silicon interposer being held between a wiring board and semiconductor elements to electrically connect the wiring board to the semiconductor elements via through-hole electrodes, the method including the steps of:

forming through holes in a silicon wafer, forming an oxide coating on the silicon wafer, providing a power feeding layer for plating on one of the surfaces of the through holes, supplying a low thermal expansion filler having a thermal expansion coefficient lower than the thermal expansion coefficient of the conductive material of the through-hole electrodes to the through holes, filling the conductive material into the through holes by plating to form the through-hole electrodes, and removing the power feeding layer for plating.

Further, according to a second aspect of the invention, there is provided a method for producing a silicon interposer being held between a wiring board and semiconductor elements to electrically connect the wiring board to the semiconductor elements via through-hole electrodes, the method including the steps of:

forming through holes in a silicon wafer, forming an oxide coating on the silicon wafer, providing a power feeding layer for plating on one of the surfaces of the through holes, forming the through-hole electrodes by using a plating solution containing a low thermal expansion filler having a thermal expansion coefficient lower than the thermal expansion coefficient of the conductive material of the through-hole electrodes and by filling the conductive material and the low thermal expansion filler into the through holes, and removing the power feeding layer for plating.

Further, according to a third aspect of the invention, there is provided the method according to the second aspect, wherein the plating solution is stirred at the step of forming the through-hole electrodes.

Hence, the conductive material for making the through-hole electrodes conductive and the low thermal expansion filler can be dispersed uniformly in the plating solution, whereby the conductive material for conduction and the low thermal expansion filler can be filled uniformly into the through-hole electrodes.

Further, according to a forth aspect of the invention, there is provided a silicon interposer being held between a wiring board and semiconductor elements to electrically connect the wiring board to the semiconductor elements via through-hole electrodes, the silicon interposer including:

a thin silicon wafer, and the through-hole electrodes which are provided at the thin silicon wafer and are filled with the conductive material and a low thermal expansion filler made of a material having a thermal expansion coefficient lower than the thermal expansion coefficient of the conductive material.

Further, according to a fifth aspect of the invention, there is provided the silicon interposer according to the forth aspect, wherein the low thermal expansion filler is any one of silica, alumina and silicon.

Hence, the low thermal expansion filler can be procured easily at low cost.

Further, according to a sixth aspect of the invention, there is provided a semiconductor device package, wherein the silicon interposer according to the forth or fifth aspect is electrically connected to the wiring board.

Further, according to a seventh aspect of the invention, there is provided a semiconductor device, wherein the semiconductor elements are electrically connected to the wiring board with the silicon interposer according to the forth or fifth aspect being held therebetween.

With the silicon interposer producing method, the silicon interposer and the semiconductor device package and the semiconductor device incorporating the silicon interposer according to the present invention, the thermal expansion coefficient of the entire through-hole electrode can be made close to the thermal expansion coefficients of the insulating coating and the insulating film connected to the through-hole electrode. Therefore, it is possible to provide a silicon interposer not causing cracks between the through-hole electrodes and the insulating coating and the insulating film making contact with the through-hole electrodes even if a thermal load is repeatedly applied, and it is also possible to provide a semiconductor device package and a semiconductor device incorporating the silicon interposer.

Furthermore, since the filler other than the conductive material is filled in the through holes, it is possible to obtain an effect of remarkably shortening the plating time when the conductive material of the through-hole electrodes is filled by electrolytic plating. Therefore, it is possible to effectively produce the silicon interposer and the semiconductor device package and the semiconductor device incorporating the silicon interposer.

DETAILED DESCRIPTION OF THE PREFERRED EMBODIMENTS

First Embodiment

An embodiment of a silicon interposer according to the present invention will be described below on the basis of the drawings. FIGS. 1A to 1D and FIGS. 5A and 5B are sectional views showing the states at the periphery of through-hole electrodes in the respective production stages of the silicon interposer according to this embodiment.

Figure 1A:
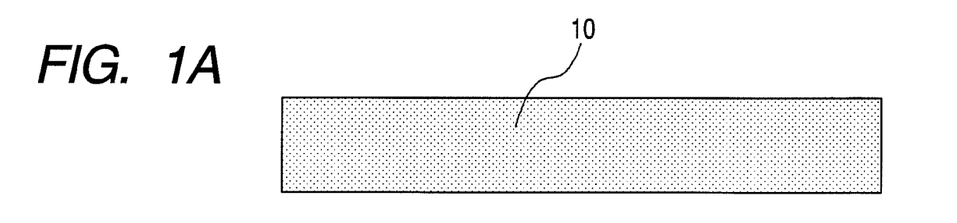
FIGS. 1A to 1D are sectional views showing the states at the periphery of the through-hole electrodes in the respective production stages of a silicon interposer according to a first embodiment.
Figure 1B:
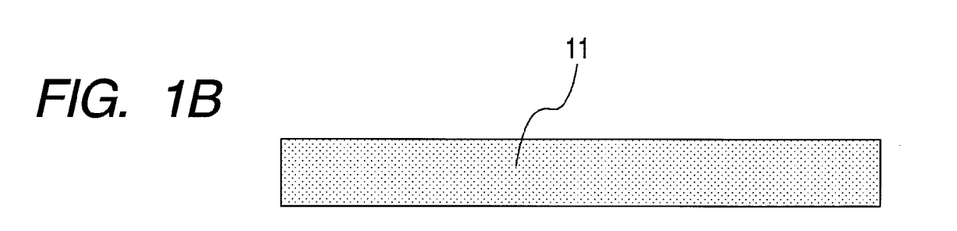
Figure 1C:
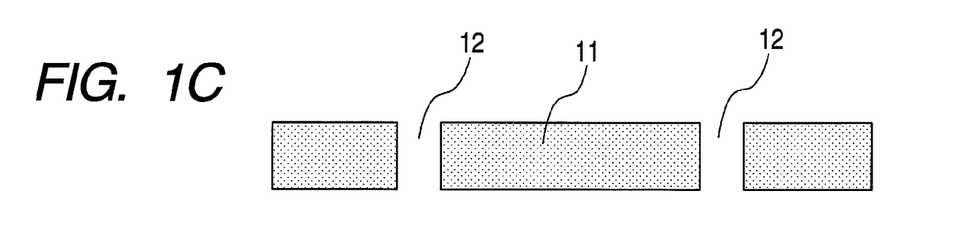

First, as shown in FIG. 1A, after a silicon wafer 10 is sliced, it is ground using a grinder or the like to a thickness of 300 μm. After the silicon wafer 10 is processed into a thin silicon wafer 11 shown in FIG. 1B, the surface of the thin silicon wafer 11 is covered with a mask having openings at regions where through holes 12 are formed, and etching is carried out, whereby the through holes 12 shown in FIG. 1C are formed. The through holes 12 according to this embodiment are formed so as to have a diameter of 60 μm. The through holes 12 are later filled with conductive materials so as to be formed into the through-hole electrodes 17 of a silicon interposer 30.

Figure 1D:
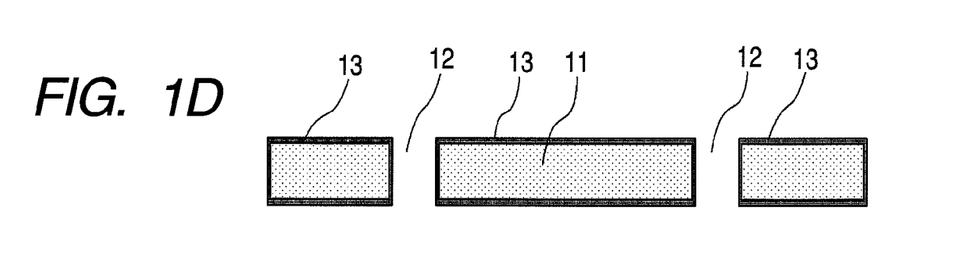

The thin silicon wafer 11 is then subjected to thermal oxidation processing to form a silicon oxide coating 13 on the outer surface of the thin silicon wafer 11 as shown in FIG. 1D. In this embodiment, the thin silicon wafer 11 is subjected to thermal oxidation processing for 6 hours at 1000° C. inside an oxygen furnace. The thickness of the silicon oxide coating 13 formed in this way is approximately 1.5 μm.

Figure 2A:
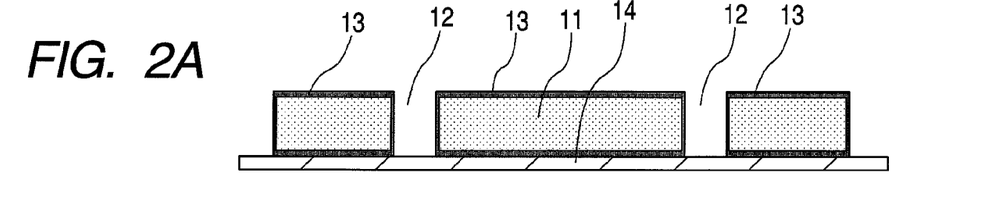
FIGS. 2A to 2D are sectional views showing the states at the periphery of the through-hole electrodes in the respective production stages of the silicon interposer according to the first embodiment.

After the silicon oxide coating 13 is formed on the thin silicon wafer 11, a metal film 14, such as a copper film, is bonded to one face of the thin silicon wafer 11 as shown in FIG. 2A. The metal film 14 is used as a power feeding layer when electrolytic plating is carried out and should only be formed to have a thickness capable of supporting silica particles 15 serving as a low thermal expansion filler and copper 16 serving as a conductive material filled into the through hole 12.

Figure 2B:
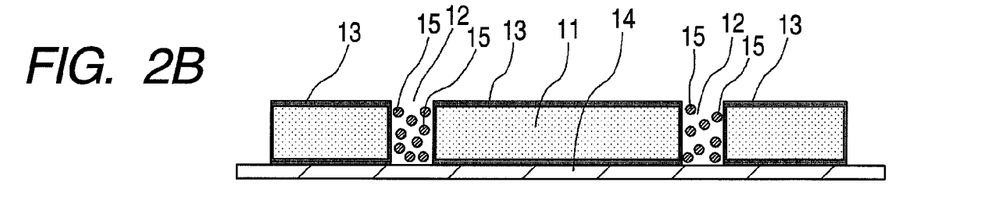

Next, as shown in FIG. 2B, the silica particles 15 are filled into the through hole 12. It is preferable that the silica particles 15 are filled into the through hole 12 in the entire height range of the through hole 12 as shown in FIG. 2B.

After a predetermined amount of the silica particles 15 is filled into the through hole 12, the copper 16 serving as the conductive material of the through-hole electrode 17 is filled into the through hole 12. In this embodiment, the copper 16 is filled into the through hole 12 using the electrolytic copper plating method. While the specific gravity of the silica particles having been filled beforehand in the through hole 12 is 2, the specific gravity of the plating solution for electrolytic copper plating is approximately 1.2. Hence, when electrolytic copper plating is carried out, the silica particles 15 having already been filled in the through hole 12 do not float and are not discharged from the through hole 12.

In addition, since the copper 16 is filled in the through hole 12 using the electrolytic copper plating method, even if the silica particles 15 have been filled in the through hole 12 beforehand, the copper 16 can be filled densely into the interspaces of the silica particles 15 and 15, whereby no problem occurs in the conduction of the through-hole electrode 17. The through-hole electrode 17 is thus completed as described above. This configuration is advantageous in that the time required for forming the through-hole electrode 17 according to the present invention can be reduced to approximately half the time required for plating according to the conventional technology in which the through-hole electrode 17 is formed of only the copper 16.

Figure 2C:
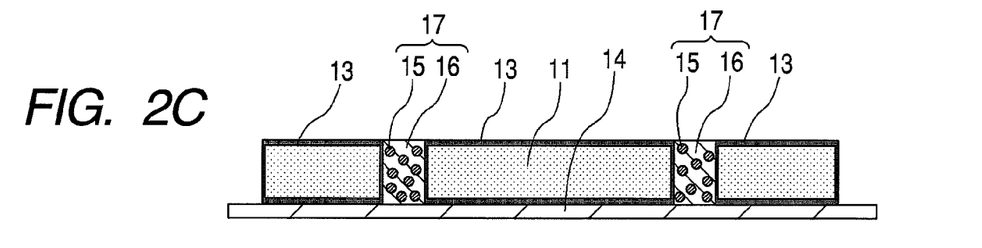
Figure 2D:
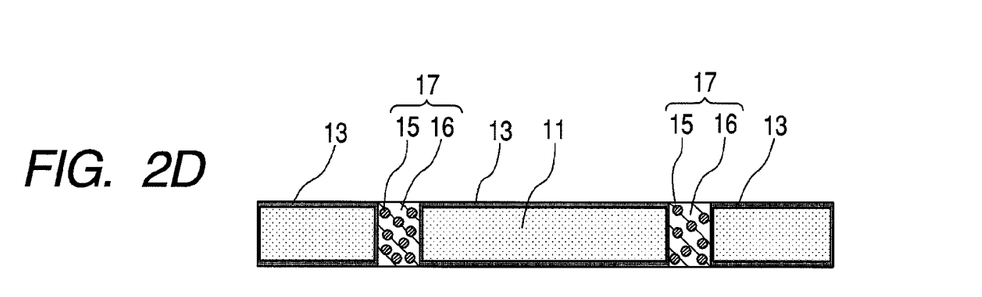

The silica particles 15 and the copper 16 are filled at approximately equal intervals in the through-hole electrode 17 as shown in FIG. 2C. After the through-hole electrode 17 is formed as described above, the metal film 14 having been used as the power feeding layer is removed from the lower surface of the thin silicon wafer 11 as shown in FIG. 2D. In the case that the surface on the upper side of the through-hole electrode 17 subjected to electrolytic copper plating is not flattened, the surface of the through-hole electrode 17 is subjected to flattening processing as necessary.

The characteristics of the silica particles 15 and the copper 16 constituting the through-hole electrode 17 will be described below.

The thermal expansion coefficient of the copper 16 for making the through-hole electrode 17 conductive is 18.3 ppm/deg C as described earlier, and this value is significantly larger than the thermal expansion coefficient (0.4 ppm/deg C) of the silicon oxide serving as an insulating coating and an insulating film at the portions connected to the through-hole electrode 17. Hence, the thermal expansion coefficient of the entire through-hole electrode 17 is reduced by filling the silica particles 15 serving as a low thermal expansion filler and having a thermal expansion coefficient lower than that of the copper 16 serving as the conductive material of the through-hole electrode 17 into the through hole 12.

In this embodiment, the thermal expansion coefficient of the through-hole electrode 17 is set at less than 10.0 ppm/deg C. Once the target thermal expansion coefficient of the entire through-hole electrode 17 has been determined, the volume ratio between the silica particles 15 and the copper 16 to be filled into the through hole 12 can be obtained by calculation. Once the volume of the silica particles 15 to be filled into the through hole 12 has been obtained, the diameter of the silica particles can be determined.

Figure 3A:
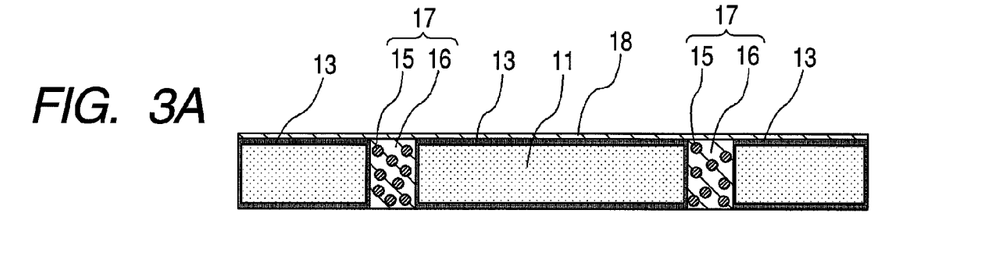
FIGS. 3A to 3D are sectional views showing the states at the periphery of the through-hole electrodes in the respective production stages of the silicon interposer according to the first embodiment.

Next, as shown in FIG. 3A, a seed layer (plated seed layer) 18 made of titanium or chromium is formed by sputtering or the like on the semiconductor element mounting face (the face on the side of the through-hole electrode 17 filled with the solder 16) of the thin silicon wafer 11. In this embodiment, the plated seed layer 18 is formed by forming a titanium sputter film of 100 nm and than by overlaying a copper sputter film of 300 nm on the titanium sputter film. In the figure, the titanium sputter film and the copper sputter film are shown in an integrated state.

Figure 3B:
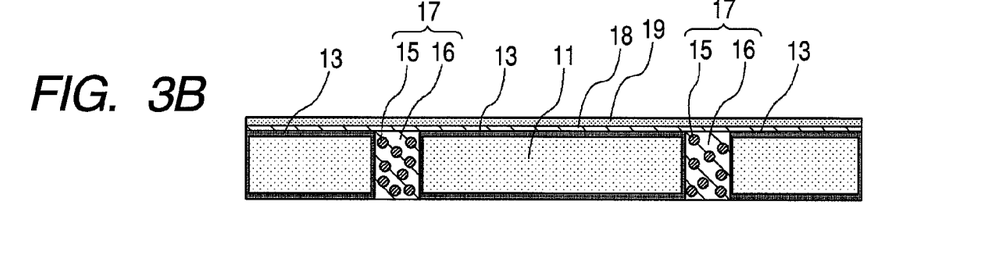
Figure 3C:
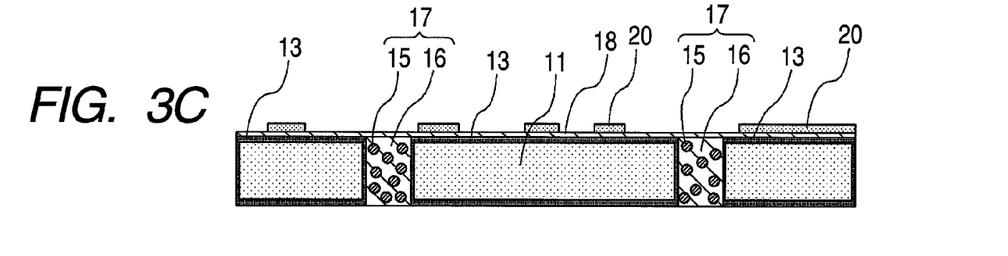
Figure 3D:
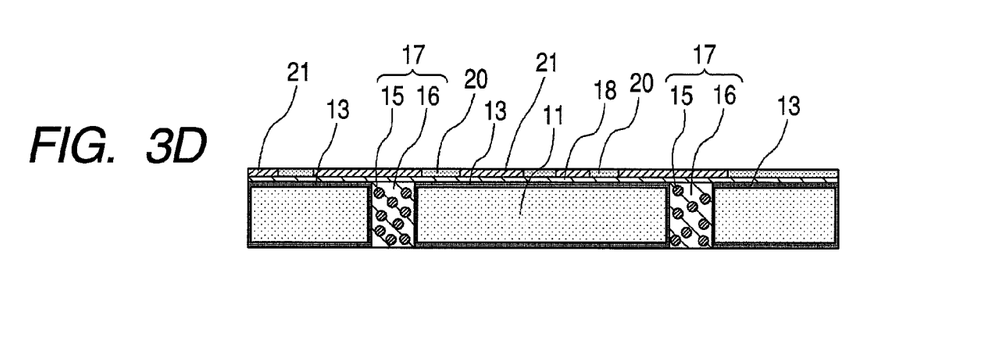
Figure 4A:
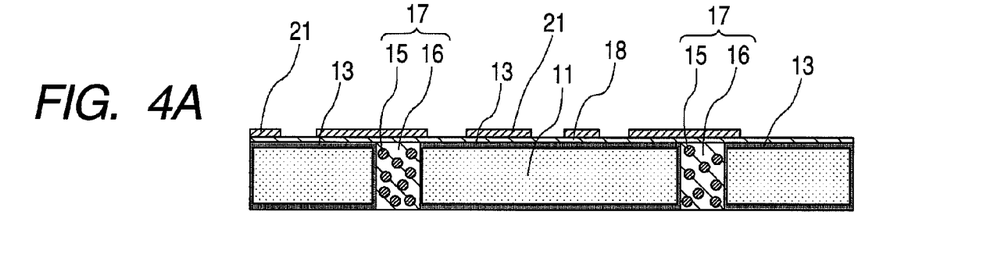
FIGS. 4A to 4D are sectional views showing the states at the periphery of the through-hole electrodes in the respective production stages of the silicon interposer according to the first embodiment.
Figure 4B:
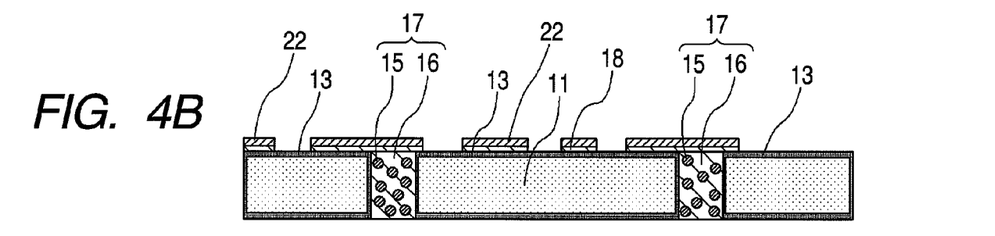

A solder resist 19 is coated as shown in FIG. 3B on the plated seed layer 18 formed as described above, and the solder resist 19 is subjected to exposure and development to form a resist pattern 20 shown in FIG. 3C. After the resist pattern 20 is formed, electrolytic copper plating is carried out to form a conductor layer 21 as shown in FIG. 3D. The conductor layer 21 according to this embodiment is formed so as to have a thickness of 3 μm. After the conductor layer 21 is formed, the resist pattern 20 is removed by carrying out etching as shown in FIG. 4A. Then, the plated seed layer 18 covered with the resist pattern 20 is selectively removed to form a wiring pattern 22 from which the conductor layer 21 is made independent as shown in FIG. 4B.

Figure 4C:
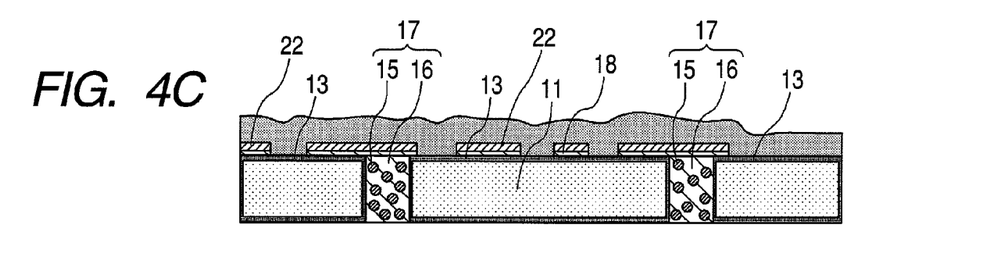
Figure 4D:
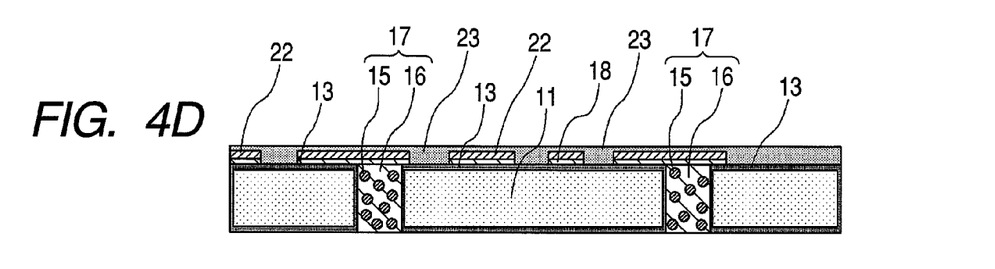

Next, as shown in FIG. 4C, the surface of the wiring pattern 22 is covered with the insulating film 23 formed of a silicon oxide film. In this embodiment, the silicon oxide film is formed using the low-temperature CVD method at approximately 200° C. After the insulating film 23 is formed, the upper face of the insulating film 23 is ground and flattened as shown in FIG. 4D. In this embodiment, the insulating film 23 on the wiring pattern 22 is flattened so as to have a thickness of 1 μm.

Figure 5A:
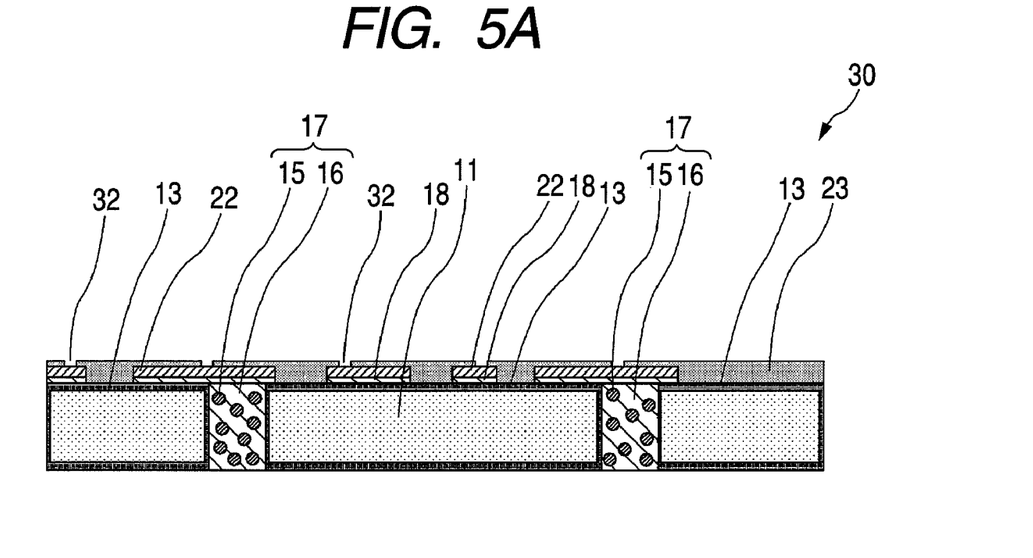
FIGS. 5A and 5B are sectional views showing the states at the periphery of the through-hole electrodes in the respective production stages of the silicon interposer according to the first embodiment.

Next, as shown in FIG. 5A, the insulating film 23 is partially removed by etching so that part of the wiring pattern 22 is exposed outside so as to serve as connection pads 32, whereby a silicon interposer 30 is formed. RIE (reactive ion etching) is applied as the etching method for the insulating film 23 according to this embodiment.

Figure 5B:
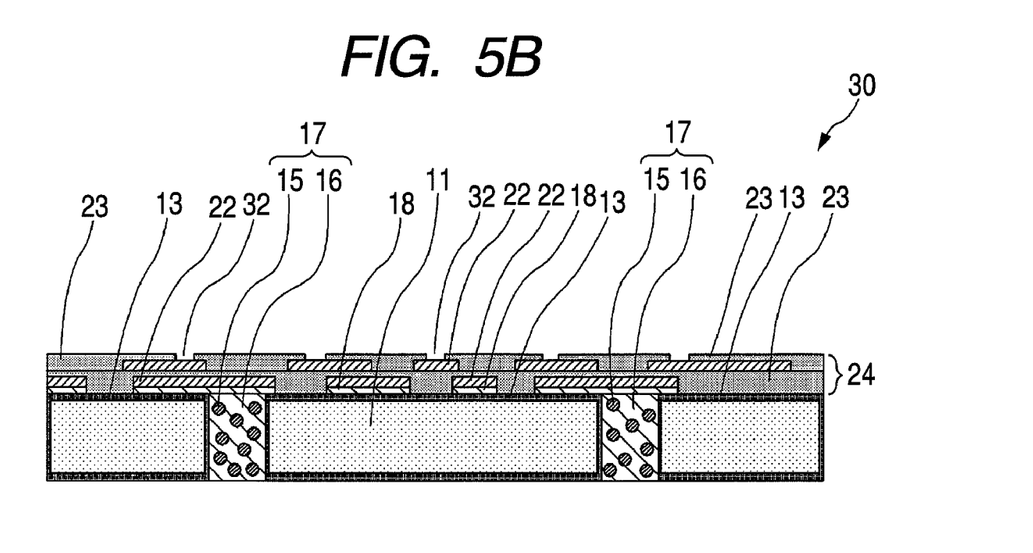

Furthermore, as shown in FIG. 5B, a multi-layer wiring 24 can be formed as necessary on the upper face side of the silicon interposer 30 (on the side on which semiconductor elements are mounted). The wiring pattern of the upper layer can be formed by conducting a procedure in which a silicon oxide film is used as the insulating film 23, a plated seed layer is formed using a method similar to the above-mentioned method, a solder resist is coated on the plated seed layer, and exposure and development are carried out to form a resist pattern, and then electrolytic plating is carried out to form a conductor layer.

It is advantageous to use a silicon oxide film as the insulating film 23 because the insulating film 23 between the layers can be flattened and high density due to formation of minute wiring can be attained.

Figure 6:
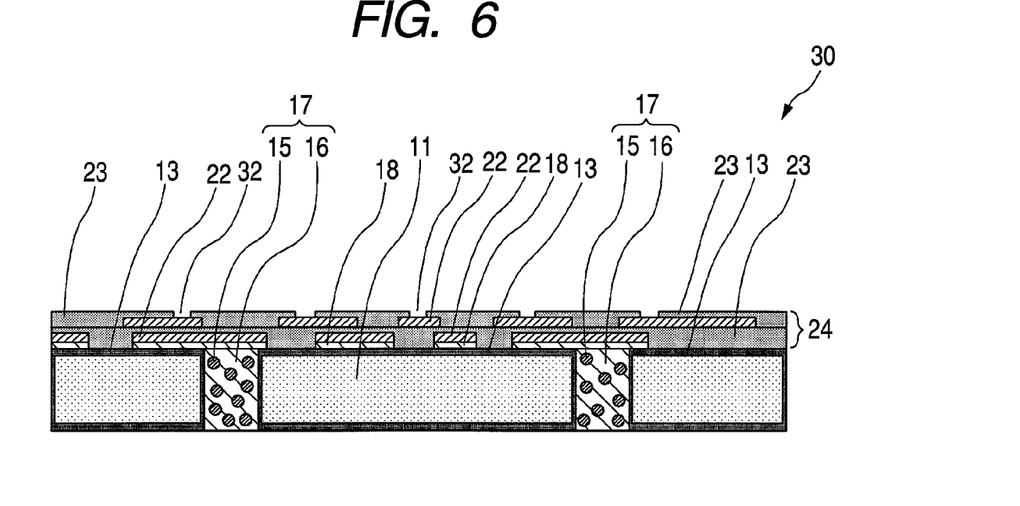
FIG. 6 is a sectional view showing the state at the periphery of the through-hole electrodes of the silicon interposer according to the first embodiment.

FIG. 6 is a sectional view showing the configuration at the periphery of the through-hole electrodes of the silicon interposer according to this embodiment. As shown in FIG. 6, the through holes 12 passing through the thin silicon wafer 11 in the thickness direction thereof are formed in the silicon interposer 30 according to this embodiment, and the oxide coating 13 is formed on the entire surface of the thin silicon wafer 11 including the inner wall faces of the through holes 12. The silica particles 15 and the copper 16 are filled into the through hole 12 to form the through-hole electrode 17.

Since the copper 16 for making the through-hole electrode 17 conductive and the silica particles 15 serving as a low thermal expansion filler and having a thermal expansion coefficient lower than that of the copper 16 are filled in the through-hole electrode 17, the thermal expansion coefficient of the entire through-hole electrode 17 can be made significantly lower than that in the case that the through-hole electrode is formed of only the copper 16. In other words, even if the through-hole electrode 17 is heated and cooled, the thermal expansion amount and the thermal shrinkage amount of the through-hole electrode 17 become close to the thermal expansion amounts and the thermal shrinkage amounts of the insulating coating 13 and the insulating film 23 made of silicon oxide and connected to the through-hole electrode 17. Hence, stress concentration owing to the thermal expansion amount and the thermal shrinkage amount can be eliminated. In other words, since cracks are prevented from occurring at the connection sections between the through-hole electrode 17 and the insulating coating 13 and the insulating film 23, the reliability of the electrical connection of the through-hole electrode 17 can be improved.

In the through-hole electrode 17, on the side (the upper face side in the figure) of the thin silicon wafer 11 on which the semiconductor element 60 is mounted, the plated seed layer 18 is formed on the oxide coating 13, and the multiple layers of the wiring pattern 22 and the insulating film 23 are provided using the semi-additive method, whereby the multi-layer wiring 24 is formed. On the upper surface of the multi-layer wiring 24, part of the wiring pattern 22 is exposed outside by etching to form the connection pads 32 of the silicon interposer 30.

Since the thermal expansion coefficient of the silica particles 15 uniformly filled in the through-hole electrode 17 is smaller than the thermal expansion coefficient of the copper 16, the thermal expansion coefficient of the entire through-hole electrode 17 becomes close to those of the insulating coating 13 and the insulating film 23 when the silicon interposer 30 having the above-mentioned configuration is heated to the solder melting temperature at the time of connecting the silicon interposer to the semiconductor element 60 as described later and then cooled to room temperature. In other words, since thermal stress concentration owing to the difference in thermal expansion coefficient at the periphery of the connection sections between the through-hole electrode 17 and the insulating coating 13 and the insulating film 23 is reduced remarkably, cracks are prevented from occurring. This configuration is advantageous in that the reliability of the electrical connection of the silicon interposer 30 is improved as the reliability of the electrical connection at the through-hole electrode 17 is improved as described above.

Figure 7:
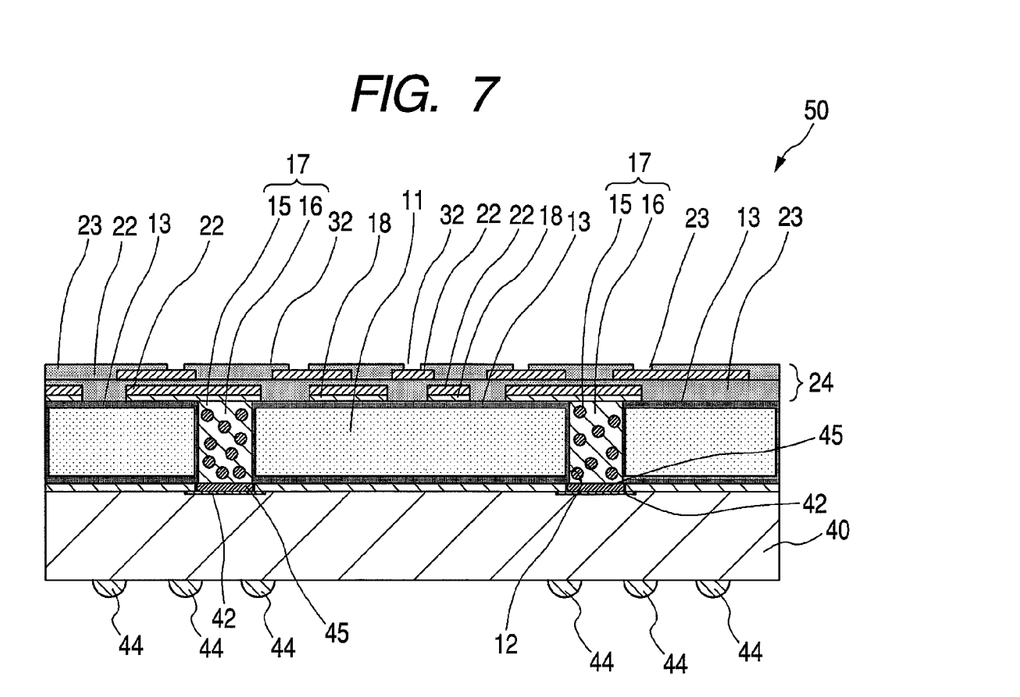
FIG. 7 is a sectional view showing the state at the periphery of the through-hole electrodes of a semiconductor device package according to the first embodiment.

In the silicon interposer 30 formed as described above, to the side of the lower faces (the side of the face to which the metal film 14 is bonded) of the through-hole electrodes 17, a wiring board 40, such as a build-up board, in which connection pads 42 and external connection terminals 44 are formed and solder 45 is applied to the connection pads 42, is connected electrically, whereby a semiconductor device package 50 shown in FIG. 7 can be obtained.

Furthermore, solder 35 is applied to the connection pads 32 formed on the surface of the multi-layer wiring 24 on the upper face of the semiconductor device package 50 shown in FIG. 7, and a semiconductor element 60 in which electrodes 62, such as gold bumps, are formed is mounted on the connection pads 32. The semiconductor element 60 is then electrically connected to the semiconductor device package 50, whereby the semiconductor device 70 shown in FIG. 8 can be obtained.

Figure 8:
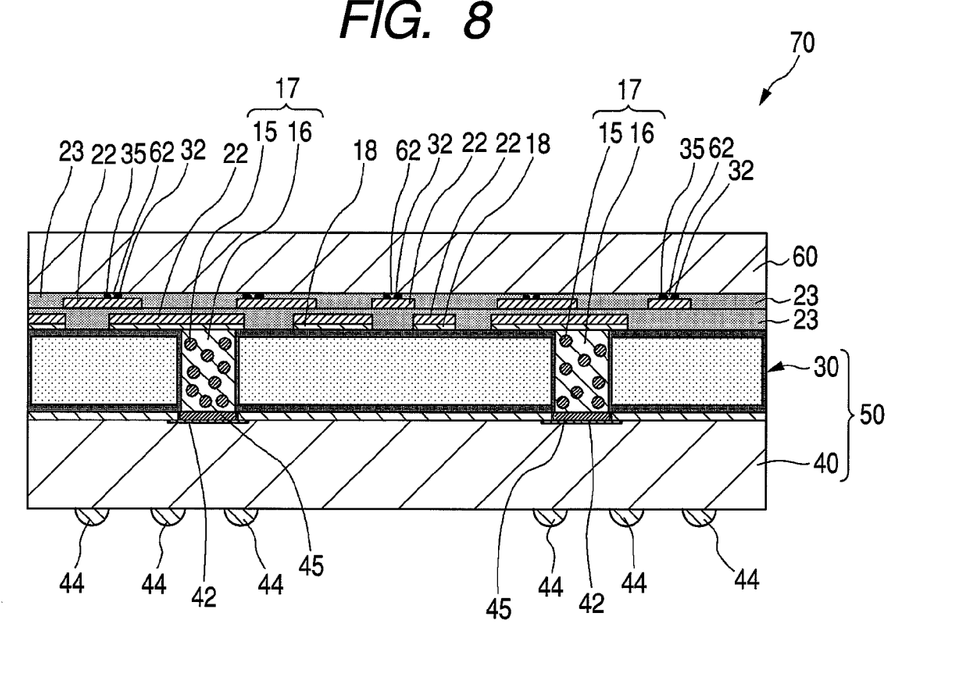
FIG. 8 is a sectional view showing the state at the periphery of the through-hole electrodes of a semiconductor device according to the first embodiment.

Moreover, it is possible that the semiconductor device 70 is mounted on a mother board or the like not shown in the figure via the external connection terminals 44 and that they are electrically connected to each other.

In the semiconductor device package 50 and the semiconductor device 70 formed as described above, the thermal expansion amount (thermal shrinkage amount) of the semiconductor element 60 can be matched with that of the silicon interposer 30. Hence, even if the silicon interposer 30 is heated to the solder melting temperature to connect the connection pads 32 of the silicon interposer 30 to the electrodes 62 of the semiconductor element 60 and then cooled to room temperature, since the thermal expansion amount and the thermal shrinkage amount thereof are very small, there is no danger of damaging the semiconductor element 60. Furthermore, since the silica particles 15 are filled in the through-hole electrode 17 formed in the silicon interposer 30 so that the thermal expansion coefficient of the entire through-hole electrode 17 is made close to those of the insulating coating 13 and the insulating film 23 formed of silicon oxide and connected thereto, cracks can be prevented securely from occurring at the periphery of the through-hole electrode 17.

Hence, the semiconductor device package 50 and the semiconductor device 70 can have very high reliability.

Second Embodiment

Figure 9:
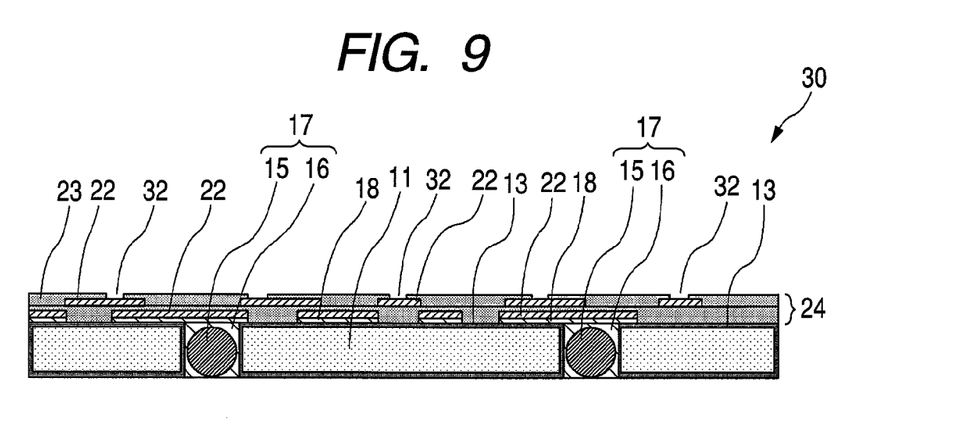
FIG. 9 is a sectional view showing the state at the periphery of the through-hole electrodes of a silicon interposer according to a second embodiment.

FIG. 9 is a sectional view showing the state at the periphery of the through-hole electrodes of a silicon interposer according to a second embodiment.

This embodiment is characterized in that, instead of filling the silica particles 15, 15, . . . in the form of multiple fine particles into the through hole 12, only one silica particle 15 formed to have a large diameter that can be accommodated into the through hole 12 is accommodated therein. The adoption of the configuration according to this embodiment is advantageous in that the silica particle 15 can be produced easily and that the work for accommodating the silica particle 15 into the through hole 12 can be carried out easily.

Third Embodiment

Figure 10:
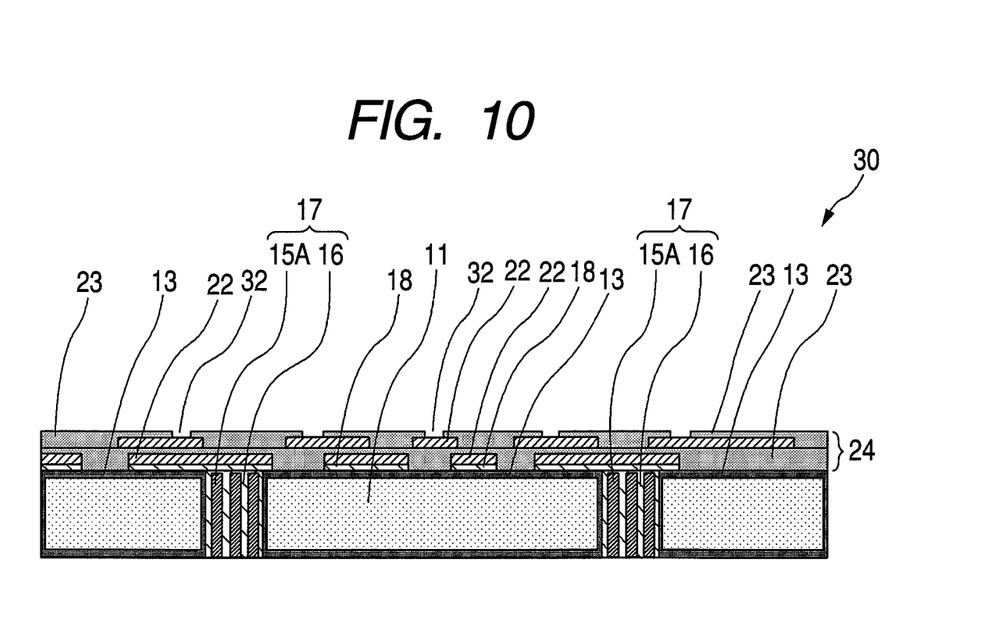
FIG. 10 is a sectional view showing the state at the periphery of the through-hole electrodes of a silicon interposer according to a third embodiment.

FIG. 10 is a sectional view showing the state at the periphery of the through-hole electrodes of a silicon interposer according to a third embodiment.

This embodiment is characterized in that acicular silica pieces 15A formed to have a size that can be accommodated into the through hole 12 is accommodated therein. It is preferable that the height of the acicular silica pieces 15A according to this embodiment is approximately equal to the height of the through hole 12. Furthermore, although multiple acicular silica pieces 15A are accommodated in the through hole 12 in FIG. 10, a single acicular silica piece 15A may also be accommodated in the through hole 12 as a matter of course.

Since the methods for producing the silicon interposer 30 and the semiconductor device package 50 and the semiconductor device package 50 incorporating the silicon interposer 30 according to the second embodiment and the third embodiment are similar to those according to the first embodiment, the descriptions of the production methods are omitted.

Fourth Embodiment

Figure 11A:
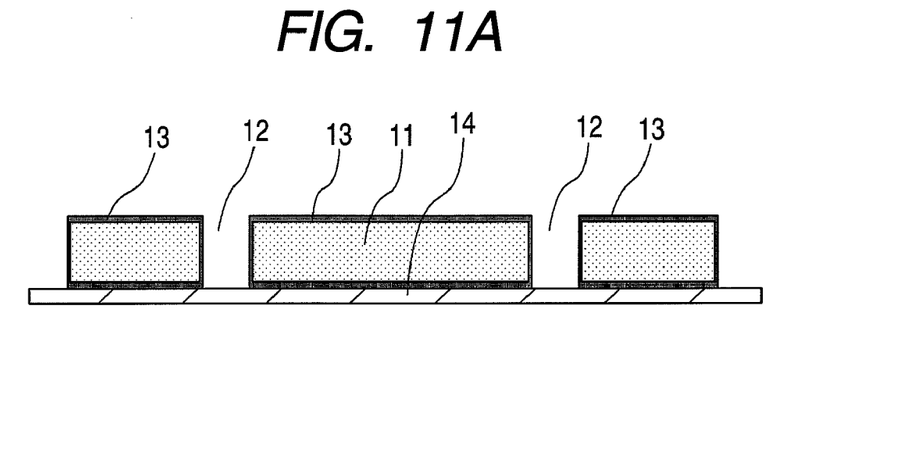
FIGS. 11A to 11C are sectional views showing the state at the periphery of the through-hole electrodes of a silicon interposer according to a fourth embodiment.
Figure 11B:
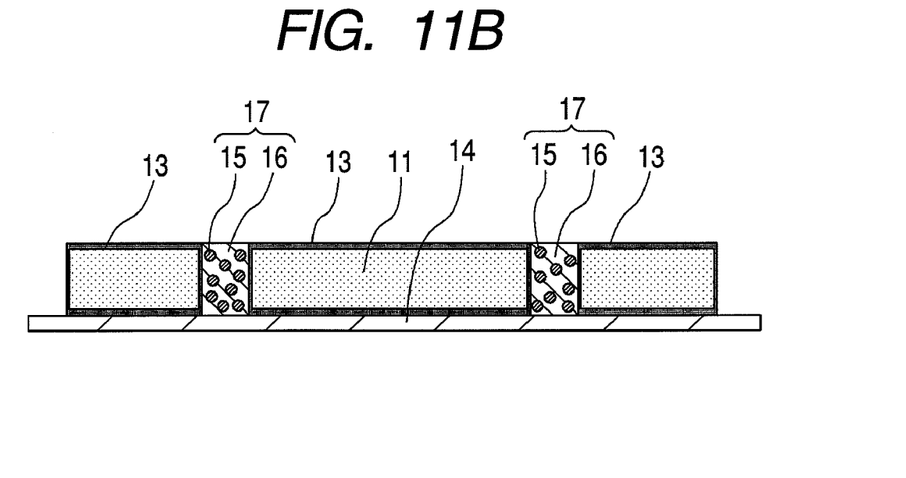
Figure 11C:
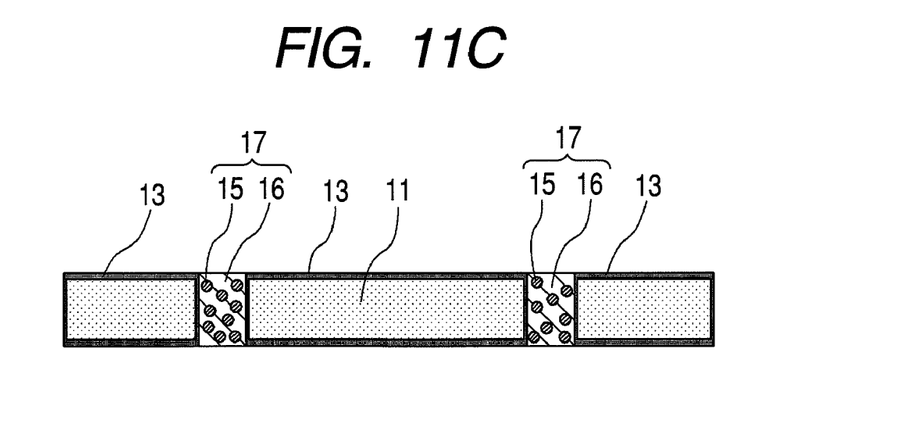

FIGS. 11A to 11C are sectional views showing the states at the periphery of the through-hole electrodes of a silicon interposer according to a fourth embodiment.

A method for forming the through-hole electrode 17 by two steps in which after the silica particles 15 are filled into the through hole 12 along the entire height thereof, the copper 16 is filled (deposited) into the interspaces of the silica particles 15 by the electrolytic copper plating method has been described in the preceding embodiments. However, this embodiment is characterized in that the copper 16 serving as the conductive material of the through-hole electrode 17 and the silica particles 15 serving as a low thermal expansion filler having a thermal expansion coefficient lower than that of the copper 16 are uniformly filled into the through hole 12 by one step.

Since the method for producing the silicon interposer 30 according to this embodiment up to the steps in which the through holes 12 are formed in the thin silicon wafer 11, the oxide coating 13 is formed on the outer surface of the thin silicon wafer 11, and the metal film 14 serving as a power feeding layer in the electrolytic plating method is bonded to the lower face of the thin silicon wafer 11 is the same as the method for producing the silicon interposer 30 according to the first embodiment, the detailed descriptions thereof are omitted herein. As shown in FIG. 11A, after the oxide coating 13 is formed on the surfaces of the thin silicon wafer 11 having the through holes 12 and the metal film 14 is bonded to the lower face thereof, plating is carried out by the electrolytic copper plating method using a copper plating solution in which the copper 16 serving as the conductive material of the through-hole electrodes 17 and the silica particles 15 serving as a filler, having a thermal expansion coefficient lower than that of the copper 16 and being capable of being deposited (filled) into the through holes 12 are mixed.

In this embodiment, a stirrer is disposed inside a bath not shown and electrolytic plating is carried out while the plating solution is stirred so that the silica particles 15 having a specific gravity (approximately 2) higher than the specific gravity (approximately 1.2) of the copper plating solution are not deposited in the plating solution. The through-hole electrode 17 can thus be formed by one step by uniformly filling the copper 16 and the silica particles 15 into the through hole 12 (as shown in FIG. 11B).

In this embodiment, although it is necessary to dispose a stirrer inside a plating bath when electrolytic plating is carried out, the time and effort for filling the silica particles 15 into the through holes 12 can be saved. Hence, this configuration is advantageous in that the time and effort for forming the through-hole electrodes 17 can be reduced remarkably.

After the through-hole electrodes 17 are formed, the metal film 14 serving as a power feeding layer is removed as shown in FIG. 1C, and the upper faces of the through-hole electrodes 17 are flattened by grinding or the like in the case that they are not flat. Since the subsequent steps are similar to the steps of the method (the semi-additive method) described on the basis of FIGS. 3A to 3D to FIGS. 5A and 5B according to the first embodiment, the descriptions of the subsequent production steps are omitted.

Since the configurations of the silicon interposer 30 and the semiconductor device package 50 and the semiconductor device 70 incorporating the silicon interposer 30 obtained according to this embodiment can be made identical with the configurations of the silicon interposer 30 and the semiconductor device package 50 and the semiconductor device 70 incorporating the silicon interposer 30 described in the first embodiment (refer to FIGS. 6 to 8), the characteristics of these are also similar to those of the silicon interposer 30 and the semiconductor device package 50 and the semiconductor device 70 incorporating the silicon interposer 30 according to the first embodiment.

Although the silicon interposer 30 and the semiconductor device package 50 and the semiconductor device 70 incorporating the silicon interposer 30 according to the embodiments of the present invention have been described above, the present invention is not limited to the embodiments described above, and other embodiments may also be made within the technical scope of the present invention as a matter of course.

For example, in the embodiments, two configurations have been described: a configuration in which when the conductive material for making the through-hole electrode 17 conductive and the filler having a thermal expansion coefficient lower than that of the conductive material are filled into the through hole 12, the silica particles 15 or the acicular silica pieces 15A having a thermal expansion coefficient lower than that of the copper 16 to be filled into the through hole 12 are filled into the through hole 12 beforehand, and then the through-hole electrode 17 is formed by carrying out the electrolytic plating method (according to the first embodiment to the third embodiment) and the other configuration in which the copper 16 and the silica particles 15 are filled into the through hole 12 using the plating solution containing the mixture of the copper 16 and the silica particles 15 and by carried out the electrolytic plating method while the plating solution is stirred (according to the fourth embodiment). However, in addition to the methods for forming the through-hole electrodes 17 according to these configurations, it may also be possible to adopt a method for forming the through-hole electrode in which a conductive paste containing a conductive material for making the through-hole electrode 17 conductive and a filler having a thermal expansion coefficient lower than that of the conductive material is filled into the through hole 12 by carrying out the printing method. It is advantageous to use the printing method on the side of the opening end of the through hole 12 as described above because the step for flattening the through-hole electrode 17 can be omitted.

Furthermore, as the configurations of the through-hole electrode 17, the configurations in which the copper 16 is adopted as a conductive material and the silica particles 15 and the acicular silica pieces 15A, each formed into a single size, are adopted as the fillers having a thermal expansion coefficient lower than that of the copper 16 have been described in the above-mentioned embodiments. However, the configurations of the through-hole electrode 17 are not limited to those described above, but configurations of components made of other materials may also be used as a matter of course. For example, it may be possible to use the silica particles 15 and the acicular silica pieces having different sizes, independently or in combination. The point is that the configuration should only be arranged so that the through-hole electrode 17 has sufficient conductivity requested thereto and so that the thermal expansion coefficient of the entire through-hole electrode 17 is made close to the thermal expansion coefficient of the silicon oxide (the insulating coating and the insulating film).

In other words, although the copper 16 is preferably used as the conductive material for making the through-hole electrode 17 conductive, other conductive materials may also be used. Furthermore, it is possible to use fillers other than the silica particles 15 and the acicular silica pieces 15A, such as aluminum particles, columnar alumina pieces, silicon particles and columnar silicon pieces, as a matter of course, provided that the thermal expansion coefficient of the entire through-hole electrode 17 can be made close to that of the silicon oxide. The conductivity of the fillers is disregarded.

What is claimed is:

1. A silicon interposer being held between a wiring board and semiconductor elements to electrically connect the wiring board to the semiconductor elements via through-hole electrodes, the silicon interposer comprising:
a thin silicon wafer,
through holes formed in the silicon wafer,
an oxide coating on the entire surface of the silicon wafer including inner wall faces of the through holes, and
through-hole electrodes which are provided in the through holes and are filled by electrolytic plating with conductive material and a low thermal expansion filler made of a material having a thermal expansion coefficient lower than a thermal expansion coefficient of the conductive material,
wherein surfaces of the through-hole electrodes are flattened to be flush with the oxide coating.

2. A method for producing a silicon interposer being held between a wiring board and semiconductor elements to electrically connect the wiring board to the semiconductor elements via through-hole electrodes, the method comprising the steps of:
forming through holes in a silicon wafer,
forming an oxide coating on the entire surface of the silicon wafer including inner wall faces of the through holes, providing a power feeding layer for plating on one of the surfaces of the silicon wafer, forming the through-hole electrodes by using a plating solution containing a low thermal expansion filler having a thermal expansion coefficient lower than a thermal expansion coefficient of a conductive material of the through-hole electrodes and by filling the conductive material and the low thermal expansion filler into the through holes, and removing the power feeding layer for plating.

3. A method for producing a silicon interposer being held between a wiring board and semiconductor elements to electrically connect the wiring board to the semiconductor elements via through-hole electrodes, the method comprising the steps of:

forming through holes in a silicon wafer, forming an oxide coating on the entire surface of the silicon wafer including inner wall faces of the through holes, providing a power feeding layer for electrolytic plating on one of the surfaces of the silicon wafer, supplying a low thermal expansion filler having a thermal expansion coefficient lower than a thermal expansion coefficient of a conductive material of the through-hole electrodes to the through holes, filling the conductive material into the through holes by electrolytic plating to form the through-hole electrodes, and removing the power feeding layer for plating.

4. The silicon interposer according to claim 1, wherein the low thermal expansion filler is any one of silica, alumina and silicon.

5. A semiconductor device package, wherein the silicon interposer according to claim 1 is electrically connected to the wiring board.

6. A semiconductor device, wherein the semiconductor elements are electrically connected to the wiring board with the silicon interposer according to claim 4 being held therebetween.

7. The method according to claim 2, wherein the plating solution is stirred at the step of forming the through-hole electrodes.

* * * * *